(12) United States Patent
Moore et al.

(10) Patent No.: US 8,498,505 B2
(45) Date of Patent: Jul. 30, 2013

(54) DIMPLED LIGHT COLLECTION AND CONCENTRATION SYSTEM, COMPONENTS THEREOF, AND METHODS

(75) Inventors: Duncan T. Moore, Fairport, NY (US); Greg R. Schmidt, Gates, NY (US); Blair L. Unger, Rochester, NY (US)

(73) Assignee: University of Rochester, Rochester, NY (US)

( * ) Notice: Subject to any disclaimer, the term of this patent is extended or adjusted under 35 U.S.C. 154(b) by 799 days.

(21) Appl. No.: 12/490,417

(22) Filed: Jun. 24, 2009

(65) Prior Publication Data

US 2010/0329619 A1 Dec. 30, 2010

(51) Int. Cl.
*G02B 6/26* (2006.01)
*H01L 31/00* (2006.01)

(52) U.S. Cl.
USPC ................................. 385/33; 385/31

(58) Field of Classification Search
USPC ....................... 136/246; 385/31, 33
See application file for complete search history.

(56) References Cited

U.S. PATENT DOCUMENTS

| | | | |
|---|---|---|---|
| 4,307,936 A | 12/1981 | Ochiai | |
| 4,389,085 A | 6/1983 | Mori | |
| 4,411,490 A | 10/1983 | Daniel | |
| 4,505,264 A | 3/1985 | Tremblay | |
| 5,877,874 A | 3/1999 | Rosenberg | |
| 6,005,692 A | 12/1999 | Stahl | |
| 6,021,007 A | 2/2000 | Murtha | |
| 6,957,650 B2 | 10/2005 | Nyhart, Jr. et al. | |
| 7,039,261 B2 | 5/2006 | Fu et al. | |
| 7,101,063 B2 * | 9/2006 | Long et al. | 362/328 |
| 7,391,939 B1 | 6/2008 | Williams | |
| 7,817,885 B1 * | 10/2010 | Moore et al. | 385/33 |
| 2007/0189701 A1 | 8/2007 | Chakmakjian et al. | |
| 2008/0043466 A1 | 2/2008 | Chakmakjian et al. | |
| 2008/0271776 A1 | 11/2008 | Morgan | |
| 2009/0126792 A1 | 5/2009 | Gruhlke et al. | |

FOREIGN PATENT DOCUMENTS

WO WO2007095049 A2 8/2007
WO WO2008131561 A1 11/2008

OTHER PUBLICATIONS

Linder, Nora; The International Bureau of WIPO, 34, chemin des Colombettes, 1211 Geneva 20, Switzerland, International Preliminary Report on Patentability; Written Opinionof the International Searching Authority; Jan. 4, 2012.

Chakmakjian et al.; Lightguide Luminaire with Controlled Numerical Aperture for General Illumination; RPC Photonics, Inc.; www.RPCphotonics.com.

* cited by examiner

*Primary Examiner* — Eric Wong
(74) *Attorney, Agent, or Firm* — William Greener; Bond, Schoeneck & King, PLLC

(57) ABSTRACT

A light guide apparatus includes a light guide layer further including light injection elements and respective light bypass elements disposed optically upstream of the light injection elements. The light injection elements and/or the bypass elements can take the form of injection facets (air prisms), surface diffraction elements, volume diffraction elements, and gradient index profiles. A light collection and concentration system comprises a single light guide apparatus, a light-transmitting medium layer disposed immediately adjacent the single light guide apparatus, and a primary light concentrator component disposed adjacent the light-transmitting medium layer, including a plurality of primary concentrator elements each of which is in optical registration with a respective one of the light injection elements of the single light guide apparatus.

33 Claims, 17 Drawing Sheets

DIMPLED LIGHT COLLECTION AND CONCENTRATION SYSTEM, COMPONENTS THEREOF, AND METHODS

CROSS-REFERENCE TO RELATED APPLICATIONS

This application is a Divisional application of U.S. Ser. No. 12/490,432 entitled Stepped Light Collection and Concentration System, Components Thereof, and Methods, filed concurrently with the instant application, the disclosure of which is incorporated by reference herein in its entirety.

JOINT RESEARCH AGREEMENT

This application is derived from a pre-existing Joint Research Agreement between the assignee of the instant application, the University of Rochester, and Abengoa Solar New Technologies, S.A.

BACKGROUND OF THE INVENTION

1. Field of the Invention

Embodiments of the invention relate generally to the field of optical light guides and, more particularly, to non-imaging, light concentrator systems, methods, and applications. Even more particularly, embodiments of the invention relate to a light collection and concentration system used for a concentrated photo-voltaic (CPV) solar energy system, and light guide components thereof.

2. Related Art

Solar energy is an important part of the renewable energy solution. Concentrated photovoltaics (CPV) have the potential to provide a source of cost effective and clean energy. By concentrating solar energy with optics, less photovoltaic (PV) material is used, reducing cost, since PVs are expensive and energy-intensive to produce compared with optical components.

Co-pending application Ser. No. 12/389,466 entitled LIGHT COLLECTION AND CONCENTRATION SYSTEM, the subject matter of which is incorporated by reference herein in its entirety, discloses a CPV system that incorporates a component light guide apparatus. The light guide apparatus includes a plurality of light directing structures 1102, 1104 (also referred to as 'light injection elements'), shown by non-limiting, illustrative example in FIG. 1. FIG. 2 illustrates the general construction of a planar light guide system as described in the related art in relation to a standard reference coordinate system. Incident light 1 from a distant, extended source (e.g., solar radiation) propagating generally in the (−)y direction is concentrated (e.g., light 2) by a lens 3 and injected into the light guide 4 via a light injection element 5. The light thereafter propagates generally in the z-direction towards an exit end 6 of the light guide. The discrete light injection element 5 is a surface portion of the light guide apparatus made by a partial transverse lateral cut extending from a region of the bottom surface 7 of the light guide. Depending upon the tilt angle of the light injection element, the index of refraction of the light guide, and the index of refraction of the external interface of the injection surface, radiation may be totally internally reflected from the face of the light injection element.

Alternatively or in addition, a similar light injection element 1102 can exist as a surface of the light guide apparatus made by a partial transverse lateral cut extending from a region of top surface portion 1021 (see FIG. 1). For light injection element 1102, radiation 1132 from a primary concentrator (not shown) optically coupled to light injection element 1102 is intercepted by the light injection element. Shaded area 1103 represents a reflective coating on surface 1102 that reflects the incident light 1132 into the structure for subsequent TIR propagation within the light guide apparatus (in the z-direction) towards and out the exit-end 1150. The exact angular orientations of the light injection elements will depend upon the nature of the reflection process (e.g., reflective (direct or TIR), refractive, diffractive), primary lens f/#, and the transport structure index of refraction $n_2$. The notched region behind the light injection element 1104 may, for example, be filled with a lower index dielectric material to facilitate TIR into the light transport structure.

Typical dimensions of the light injection elements are 130 µm–140 µm for the tilted reflecting surface, a base dimension of about 130 µm, and a height dimension of about 140 µm. Depending upon the length (z-direction) and width (x-direction) of the transport structure, there will be many light injection elements (1102, 1104, both), which necessarily exist in the transport structure.

In CPV applications, a general object of the system is to collect as much solar radiation as possible and concentrate that radiation as much as possible for input to a PV cell. The presence of the light injection elements results in a non-ideal light guide since light propagation through the transport structure is hindered by interactions with downstream light injection elements. Light loss can occur by absorption or scattering at a light injection element, out-coupling of light at a light injection element, or étendue dilution from interaction with a light injection element. Further system objectives include maximizing primary concentrator acceptance angle, maximizing injection concentration, maximizing light guide concentration, and minimizing component and system weights and thicknesses.

SUMMARY

An embodiment of the invention is a light guide component. The light guide component includes a light guide layer having a top surface and a bottom surface, at least one of which is a substantially planar surface, and a transversely oriented side-end (exit) surface that forms an output aperture of the guide layer. The guide layer has an index of refraction, $n_1$, that is greater than an index of refraction, $n_{med}$, of a medium in contact with at least a portion of the top and/or bottom surface in order to promote light propagation by total internal reflection (TIR) within the light guide. As such, the light guide may include a light-transmitting medium layer disposed immediately adjacent at least one of the top and bottom surfaces of the light guide. As illustrated with reference to the related art system in FIG. 2, the guide layer has a length dimension along the z-axis; i.e., in an intended light propagation direction towards the output aperture. The guide layer includes a plurality of light injection elements disposed in the top and/or bottom surface and/or in some cases between the top and bottom surfaces. The guide layer further includes a respective plurality of bypass elements disposed optically upstream of each injection element whenever an injection element would interfere with light propagation through the light guide.

According to an aspect, each of the injection elements is a facet formed by a transverse cut into the surface of the guide layer and which extends inwardly from the surface at an angle thereto. The space behind each facet may be air or a material having a lower index of refraction than that of the guide layer into which the facet is formed. This aspect of the injection element is the same as that disclosed in application Ser. No.

12/389,466, id. In the instant embodiment, this type of injection element will be referred to hereinafter as an air prism.

In another aspect of the invention, the guide layer includes a plurality of substantially flat diffractive elements (e.g., diffraction gratings) disposed in the plane of the top and/or bottom surface(s) and/or in a flat, non-tilted orientation within the guide layer between the top and bottom surfaces. In this aspect, bypass elements may not be included in the guide layer.

In another aspect of the invention, the guide layer includes light injection and/or bypass elements in the form of volume diffraction elements (e.g., volume holograms). The volume diffraction elements will be disposed in the planar top and/or bottom surface(s) and/or in the guide layer between the top and bottom surfaces. Alternatively or in combination therewith, a respective plurality of bypass elements in the form of volume diffraction elements may be disposed in the guide layer optically upstream from each respective injection element, where the injection elements need not be limited to diffraction elements but may also include the surface cut type injection elements mentioned above.

In other aspects, a gradient index (GRIN) in the guide layer may be used both as a dimple (bypass+injection element) or solely as a bypass structure and technique. GRIN bypass structure may be especially advantageous when used in conjunction with the air prism type injections elements mentioned above. In various aspects, linear or parabolic gradients may be established in different directions and orientations in the guide layer.

The combination of a light injection element and a bypass element of any type or form described herein will be referred to herein as a "dimple". A light guide including a guide layer with one or more dimples will be referred to herein as a "dimpled light guide". Dimpled light guides are a form of non-imaging light concentrator that allow for improved light concentration in a thin and lightweight form factor.

According to non-limiting aspects, the top and/or bottom surfaces of the light guide component may have a flat, a staircase, a saw-tooth, an echelon (slanted-staircase), curved, or otherwise shaped top or bottom surface. According to further alternative aspects, the light injection elements may be disposed in the interior of the transport structure in the form of prisms, gratings, quantum dots, photonic crystals, and other structures that would be able to provide the required function of the light injecting elements with or without a primary concentrator.

Another and related embodiment of the invention is directed to a light collection and concentration system. The system includes a primary light concentrator component coupled to a single light guide such as described in the various aspects hereinabove. The system may advantageously include a secondary light concentrator associated with the single light guide. The system may also further include a PV cell disposed adjacent the light output aperture. In various, non-limiting, alternative aspects, the primary light concentrator component may be any of a variety of known elements that can collect incident solar radiation and concentrate this incident radiation into a smaller area (i.e., onto an injection element). Refractive elements (e.g., lenses), reflective elements (e.g., mirrors), and diffractive elements (e.g., gratings, holograms) are non-limiting examples of primary light concentrators that may be used. According to various non-limiting aspects, a single primary light concentrator element of the primary component may take the form of a conventional focusing lens, a Fresnel lens, a cylindrical lens, a parabolic mirror (or segment thereof), an angle-angle concentrator, and other optics known in the art. In an advantageous aspect, the primary light concentrator component is a refractive lens array in an alternating tiled configuration. Each component optical element of the primary concentrator is associated with a respective light injection element in the light guide.

Since it is intended that primary light propagation in the guide layer be by TIR, at least either the top or bottom surface of the guide layer will be bounded by a medium having an index of refraction that is lower than the index of the guide layer material. The location of the lower index medium immediately adjacent the top and/or bottom surface of the guide layer may depend on whether the light injection elements are in the top or bottom surface of the guide layer. Various one-sided and two-sided light guides will be described in detail below.

The aforementioned light collection and concentration system provides a means by which light that is for the most part normally incident (i.e., within an allowable acceptance angle) on the primary concentrator component, and concentrated by the primary concentrator component, is input to and/or directed in a different, desired propagation direction in the light guide towards the output aperture of the transport structure. Thus the light injection elements suitably function to capture the primary-concentrated light spot that is for the most part normally incident on the system and redirect it, illustratively, at 90 degrees, in order for it to propagate along the length (z-direction) of the light guide towards the exit-end thereof.

The light guide layer discussed above is in the form of a thin sheet waveguide; i.e., having a thickness, T, much less than the general length, L, of the structure and thus having a low aspect ratio defined by T/L. An optional secondary light concentrator may be provided in the light guide and system embodiments disclosed herein, which serves to collect the light propagating in the low-aspect-ratio guide layer and further concentrate it for out-coupling through the exit-end of the guide layer and, advantageously, into a PV cell disposed to directly receive the out-coupled light. According to a non-limiting aspect, a secondary light concentrating optical component may be operatively coupled to (e.g., molded to, cemented to, free-space-aligned to, etc.) the exit-end of the light guide to secondarily concentrate and out-couple the light into the PV cell. The secondary concentrator may be made of the same or a different material than the guide layer. Alternatively, the exit-end itself of the guide layer may be shaped (e.g., parabolically-tapered; straight-tapered; trapezoidally-tapered; or, otherwise appropriately shaped) to integrally form the secondary concentrator in the exit-end of the guide layer. Such shapes will support all types of reflection (TIR and/or specular reflection and/or diffuse reflection) of the light propagating in the light guide.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description are merely exemplary of the invention, and are intended to provide an overview or framework for understanding the nature and character of the invention as it is claimed. The accompanying drawings are included to provide a further understanding of the invention, and are incorporated in and constitute a part of this specification. The drawings illustrate various embodi-

DETAILED DESCRIPTION

Figure 1:
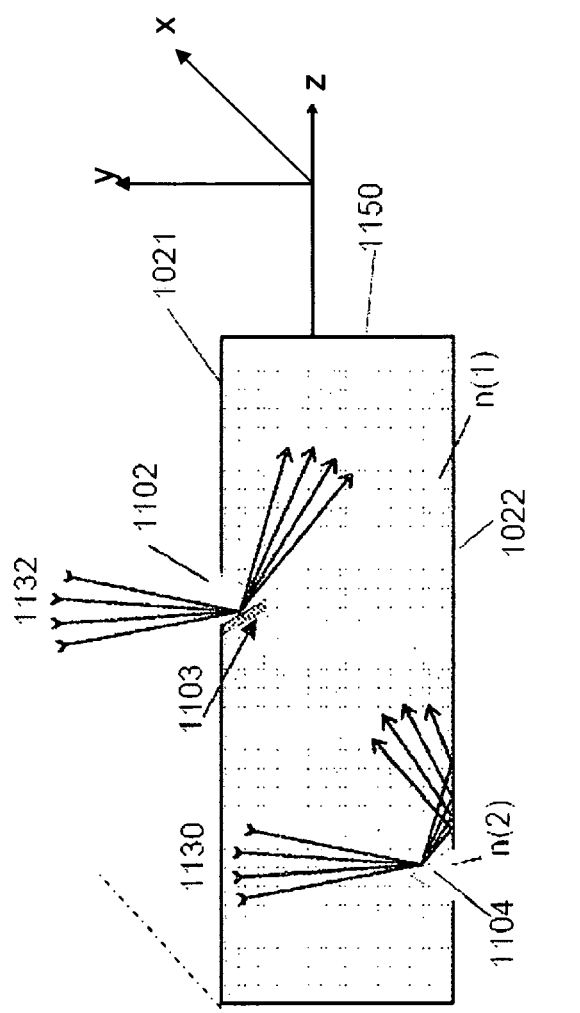
FIG. 1 schematically shows in cross section an illustrative light guide with two exemplary light injection elements according to the related art.

Reference will now be made in detail to the present exemplary embodiments of the invention, examples of which are illustrated in the accompanying drawings. Wherever possible, the same reference numbers will be used throughout the drawings to refer to the same or like parts.

A 'dimple' according to a representative aspect of the invention is shown in FIG. 3, and is designated generally throughout by reference numeral 10. As used herein in accordance with a non-limiting embodiment of the invention, the term 'dimple' refers to a structural component of a planar light guide. As illustrated in FIG. 3, the dimple 10 is composed of two parts: a light injection element 11 and a light bypass element 12. Each injection element in the light guide is located to receive focused or near-focus light from a respective primary light concentrator element (e.g., lenslet) as described in greater detail below. In the instant aspect, the injection element acts to redirect light from a direction generally normal to the light guide (-y direction in FIG. 1) to a propagation direction in the light guide (z-direction) towards the exit window of the guide layer. The bypass element acts to redirect light propagating within the guide layer in the z-direction around downstream injection elements. Since the injection elements that protrude into the interior of the guide layer create a non-ideal light guiding structure, they can cause light leakage by refraction or reflection at angles that no longer satisfy the TIR condition for propagation within the guide layer. The bypass element is intended to reduce this disruption, decreasing the loss and thus increasing maximum out-coupled light concentration.

Figure 3A:
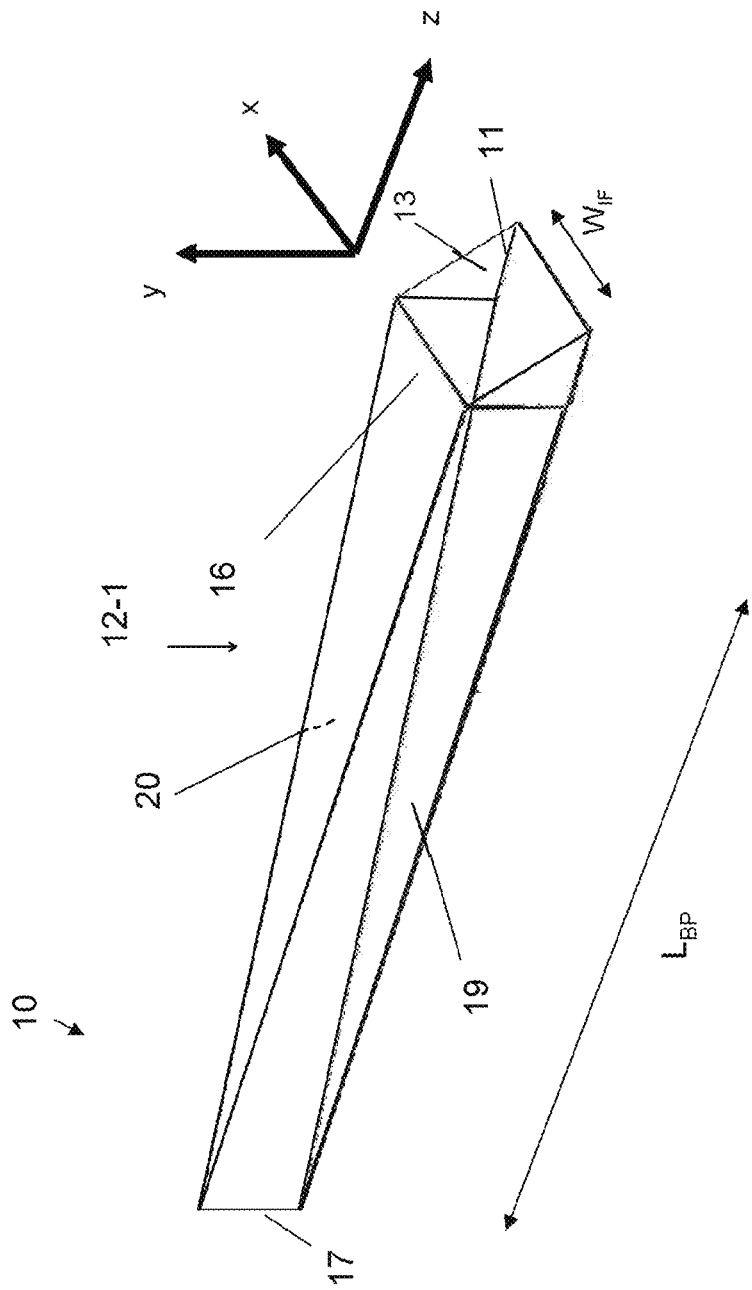
FIG. 3A shows a perspective constructional view of a multi-surface by-pass prism dimple having un-tilted reflection surfaces.

The function of the dimple is further explained by a non-limiting example of the injection and bypass elements as illustrated in FIG. 3A. The light injection element 11 (see, e.g., 1102, 1104 in FIG. 1) is an air prism whose face surface 13 is an injection facet for the light guide 1150 shown by example in FIG. 1. The bypass element 12-1 is also configured as an air prism (or another material having an index of refraction that is less than the index of the light guide material). The head end 16 of this bypass prism is coupled to the back of the injection element opposite the injection facet 13, with its height and width (shape) constrained to be the same as the that of the back face of the injection prism. The tail end 17 of the bypass prism comes to sharp edge. The bypass prism includes two angled, un-tilted (in the y-z plane), non-tapered, material 'side' surfaces 19, 20 that totally internally reflect the light traveling in the transport layer (z-direction) due to their angular orientation and material properties, and which redirect the propagating light into the x- and/or y-directions to reduce or avoid interactions with the downstream dimples.

The injection facet orientation with respect to the light guide layer determines the initial direction of light propagation in the guide. Two parameters define this orientation: a tilt of the facet with respect to the optical axis of each lenslet and a clocking around that axis. Nominally, the injection facets are clocked to point directly down the guide to the exit face in the +z direction. This leaves one free parameter-facet tilt. Since the dimples are contained within the light guide layer, the angles of incidence between light and the facet should satisfy the TIR condition to avoid reflectivity losses inherent with reflective coatings. The constraint of TIR limits the angle at which light can be injected into the guide without loss. Specifically, the injection facets should be oriented so that all of the angles produced by the primary concentrator elements (hereinafter, 'lenslets') satisfy TIR, given by:

$$\theta_{critical} = \arcsin[n_{air}/n_{LG}], \text{ and } \theta_{critical} \geq \theta_{facet} + \arcsin[N.A._{z,lenslet}/n_{LG}] \quad (1)$$

Each lenslet's numerical aperture ($NA_z$) should be small, since the TIR condition for optical glass is close to 45°. In the direction orthogonal to both incoming and reflected light propagation, $NA_x$ is not constrained, since all angles will satisfy the TIR condition if $NA_z$ satisfies TIR. In an aspect, therefore, lenslet apertures will be rectangular (discussed further below), but may also be circular, hexagonal, or other geometric, close-packed, and non-close-packed shapes.

Figure 2:
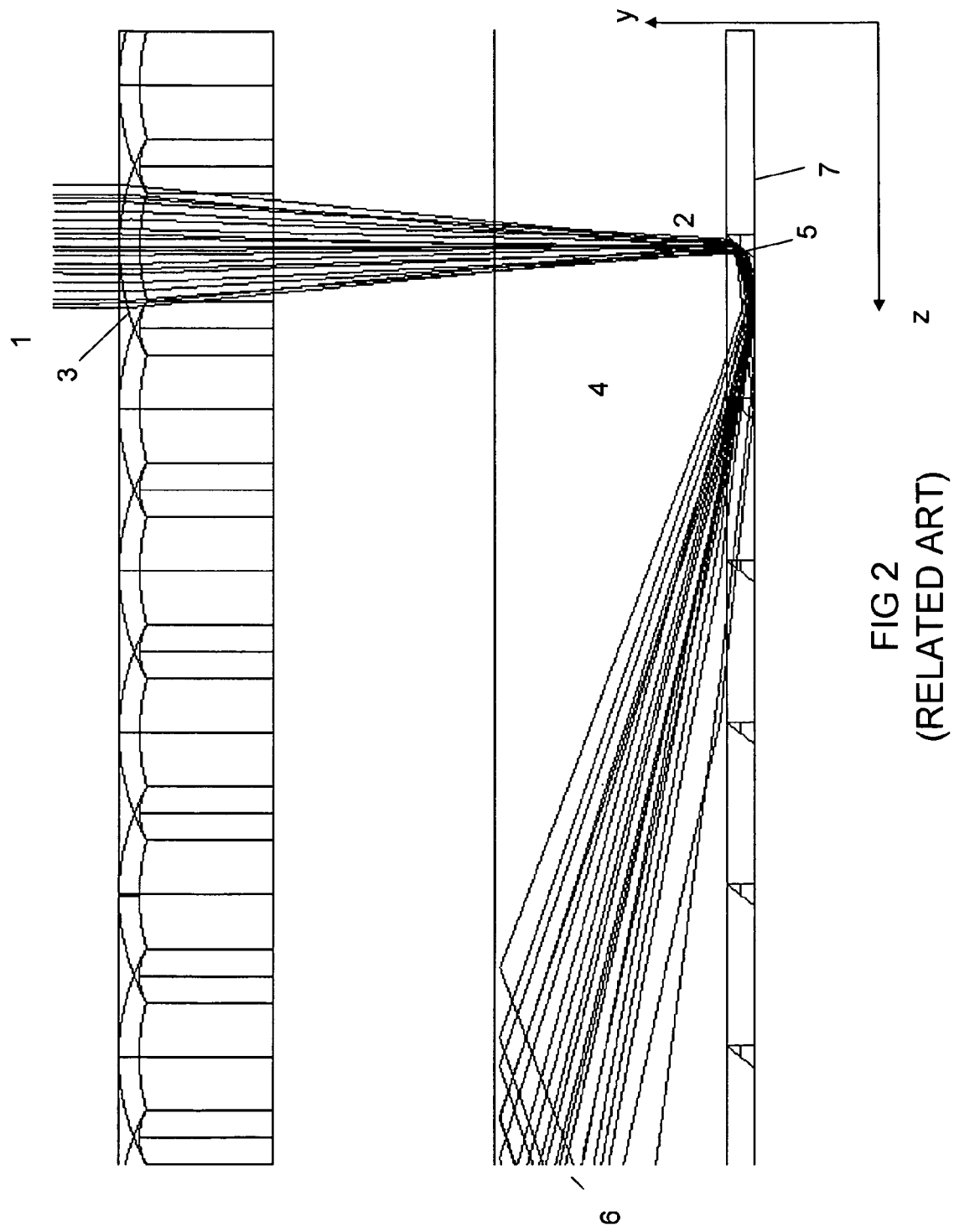
FIG. 2 schematically shows in cross section an illustrative planar light guide solar collection and concentration system with coordinate system according to the related art.
Figure 3B:
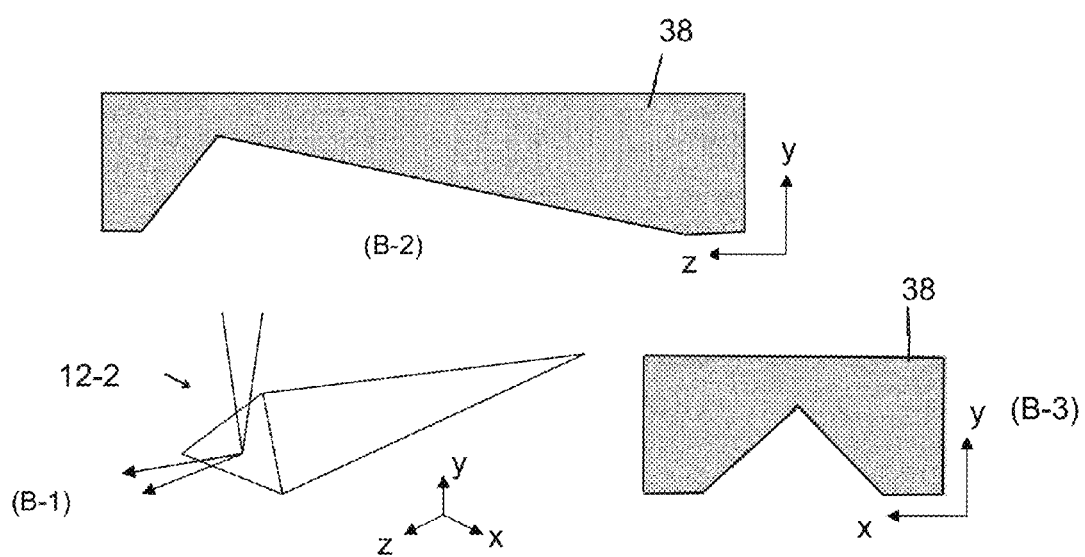
FIG. 3B illustrates a multi-surface by-pass prism dimple having tilted reflection surfaces.
Figure 3C:
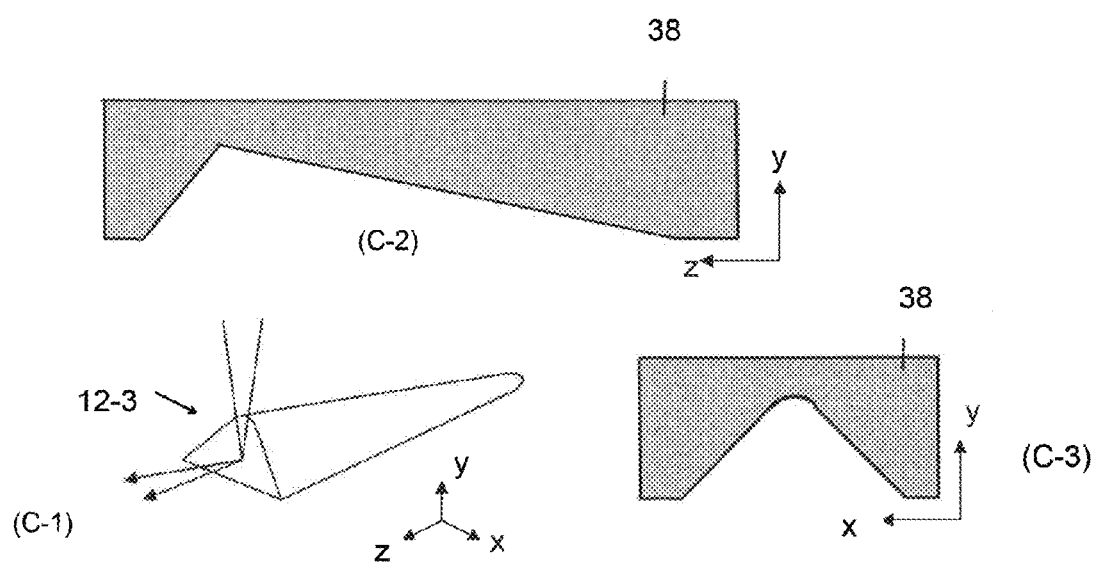
FIG. 3C illustrates a multi-surface by-pass prism dimple having tilted reflection surfaces whose edges have a fillet radius; and, FIG. 3D illustrates a one-sided by-pass prism dimple having a conical surface, according to alternative, illustrative aspects of the invention.
Figure 3D:
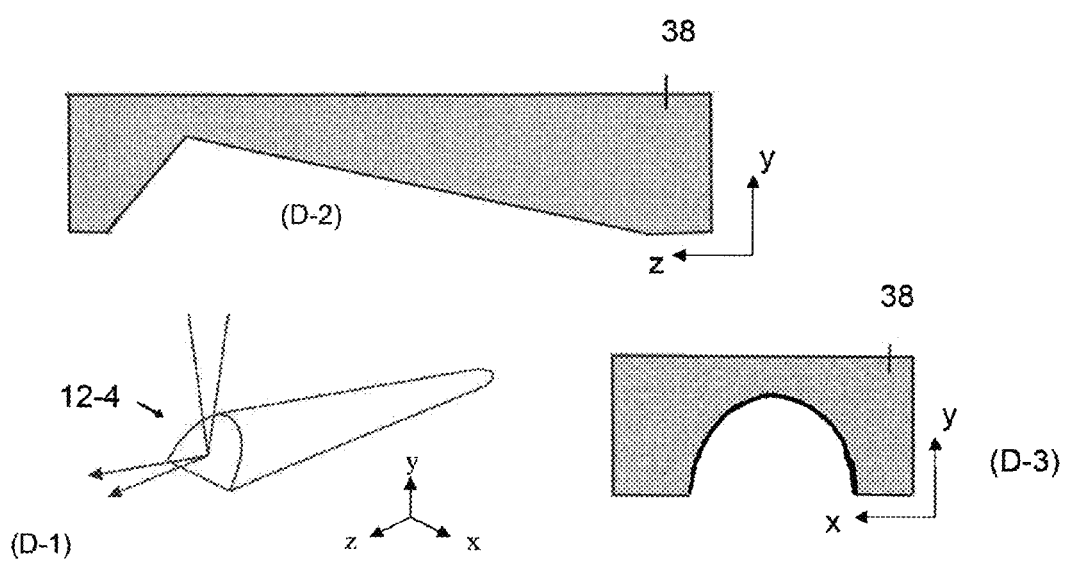
Figure 4:
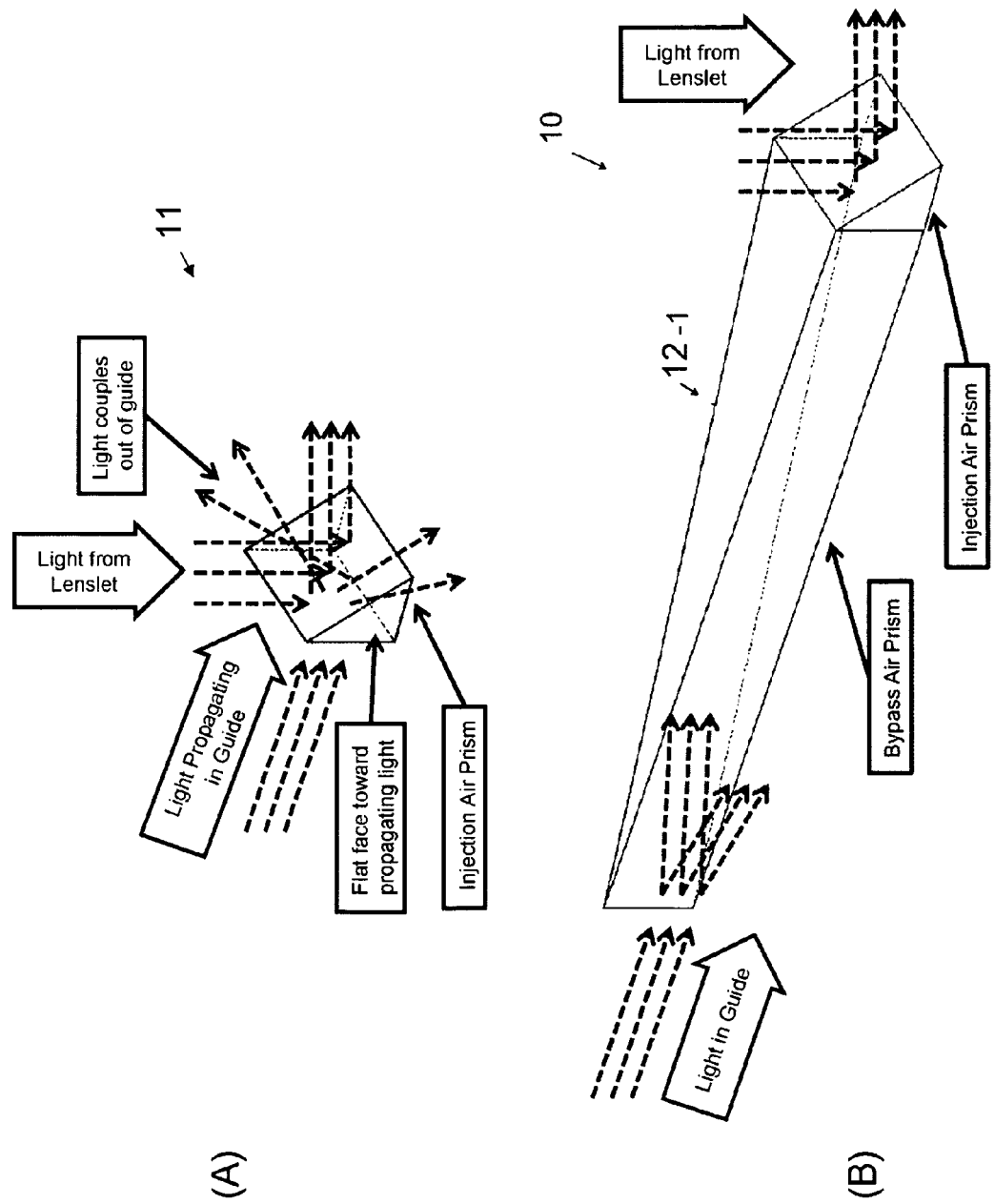
FIGS. 4A, B illustratively show an air prism injection element and a dimple, respectively, according to an aspect of the invention as shown in FIG. 3A.

The second part of the dimple, according to the present embodiment, is the by-pass prism, which is coupled to the back of the injection facet. Its purpose is to reduce light leakage from the guide layer by redirecting light around the injection prism. Instead of a direct loss, the bypass prism increases the angular distribution of light in the guide layer. The bypass prism redirects light into the x- and/or y-dimensions of the guide layer. The cross-section of the bypass prism may be a rectangle with the x-dimension growing smaller towards the apex (rear) of the prism, as shown in FIG. 3A. Other cross sectional shapes may be advantageous depending on the prescribed concentration ratio, guide length, and guide height. The bypass prism may have a cross section that decreases in size in both x- and y-dimensions from front to rear, so that the apex of the bypass prism comes to a point; or, the bypass prism may have a cross-section taper in the y-dimension only. Alternatively, the cross-section may be circular, elliptical, or otherwise geometrically shaped. For example, FIG. 3B-1 illustrates a by-pass prism 12-2 having a triangular cross section that tapers in the y-direction from front to rear. FIGS. 3B-2 and 3B-3 show side-cross sectional and end-cross sectional profile views, respectively, of the by-pass prism in the light transport structure according to an aspect. In another aspect as shown in FIG. 3C-1, the by-pass prism has a semi-triangular cross section similar to that of by-pass prism 12-2, only the top and end edges have a fillet radius that may make for an easier manufacturing process. FIGS. 3C-2 and 3C-3 show side-cross sectional and end-cross sectional profile views, respectively, of the by-pass prism in the light transport structure. In an alternative aspect, a tapered, one-sided, conical cross section by-pass prism 12-4 is illustrated in FIG. 3D-1. FIGS. 3D-2 and 3D-3 show side-cross sectional and end-cross sectional profile views, respectively, of the by-pass prism in the light transport structure.

From simple geometry, two dimensions determine the wedge angle $2\theta_{BP}$ of a two-sided bypass prism as shown in FIG. 3A: the width $W_{IF}$ of the injection facet and the length $L_{BP}$ of the bypass prism, where:

$$\theta_{BP} = \tan[W_{IF}/2L_{BP}] \quad (2)$$

If the incidence angle of incoming light is less than the critical angle of the guide with respect to $\theta_{BP}$, the bypass prism will add $2\theta BP$ to the x-direction cosine. If the incident light is beyond the critical angle, light will refract through the bypass prism and be lost from the guide layer. Since the dimples make up only a small part of the cross-sectional area of the light guide, only a small percentage of light interacts with any given dimple. This interaction probability depends on the relative size and spacing of the dimples and the incidence angle of light on the dimples. Light with a larger X-component will experience a larger dimple cross-section because the bypass prisms are long and thin.

Figure 10:
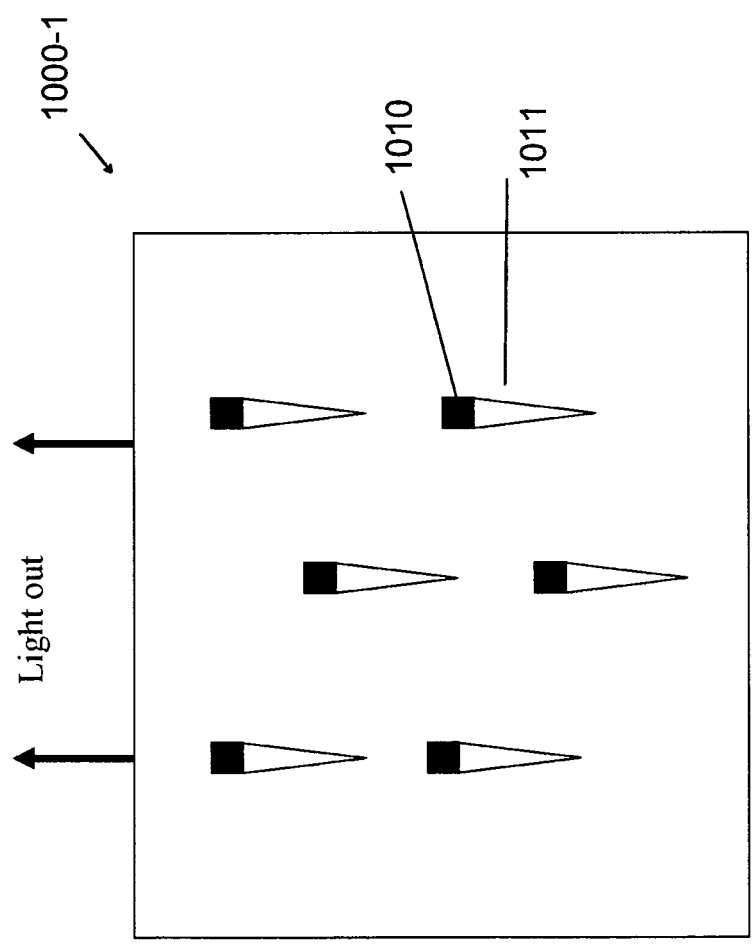
FIG. 10 is a top plan view of a dimpled light guide according to an illustrative embodiment of the invention.

FIG. 10 is a top plan view of a dimpled light guide 1000-1 according to an illustrative, exemplary embodiment. The black squares 1010 represent air prism injection facets extending upward and tilted from the bottom surface of the guide layer. The bypass prisms 1011 are shown extending rearwardly from each of the injection elements.

According to the various aspects of the invention, the light injection elements are not necessarily limited to air prisms as discussed hereinabove. According to an aspect, a diffraction grating or diffractive element can be used either in transmission or reflection to inject light into the guide layer. The general path of the light will be similar to that of the TIR/reflective air prism injection facet, however, the diffractive element is disposed in a plane parallel to the guide layer surfaces; i.e., either on the top or bottom surface or between the surfaces. Incident light will be concentrated by a primary focusing element to a small spot and onto the diffractive element. The diffractive element diverts the incident beam of light into angles that can propagate within the guide layer, typically less than 50° from parallel with respect to the guide. The diffractive elements have an insubstantial vertical extent, thus the obstruction by diffractive elements to light propagating in the guide will be less than the corresponding air prism injection elements. Also, light propagating in the guide layer that encounters a diffractive element will be diffracted into multiple orders and may still be contained within the guide layer.

In regard to the grating structure, the period of the diffraction grating must satisfy $\theta_m \geq \theta_{critical}$, where $\theta_m$ is the diffracted angle into the mth order, and $\theta_{critical}$ is the maximum angle of light supported by the guide layer;

$$\theta_m = \sin^{-1}\frac{n_{guide}(m\lambda + \sin\theta_i)}{d}, \theta_{critical} = \sin^{-1}\frac{n_{bounding}}{n_{guide}}\sin\theta_i$$

where $n_{guide}$ is the index of refraction of the guide layer, $\lambda$ is the wavelength, $\theta_i$ is the incident angle of light with respect to the surface normal, d is the grating period, and $n_{bounding}$ is the index of the bounding media of the guide. This condition must be satisfied for all diffracted orders of interest, which will advantageously be one or two dominant orders. The spacing of the repeated structure will determine the angles of diffraction and will apply regardless of the specific structure of the grating. The specific structure may be optimized to maximize the energy diffracted into one or two orders of interest.

Figure 5:
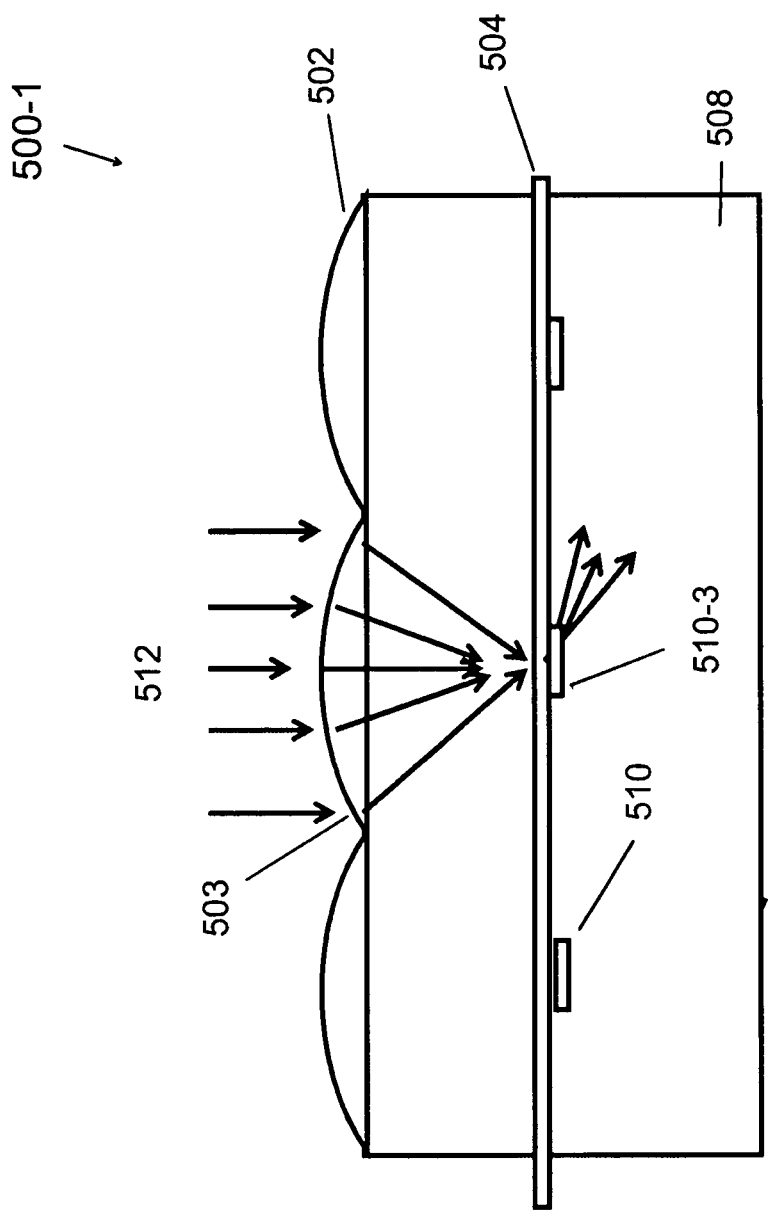
FIG. 5 schematically shows in cross section a light collection and concentration system including a light guide having diffraction-based light injection elements, according to an exemplary aspect of the invention.

FIG. 5 schematically illustrates in cross section a light collection system 500-1 that includes a primary concentrator in the form of a refractive lenslet array 502, a lower index TIR medium layer 504, and a guide layer 508 including transmission diffraction gratings 510 disposed in the upper surface of the guide layer. Incident light 512 is concentrated (e.g., focused or not) by a lenslet element 503 onto a respective diffraction grating 510-3. The grating can be designed to diffract one or two dominant transmitted orders into the guide layer as shown by the arrows therein.

Figure 6:
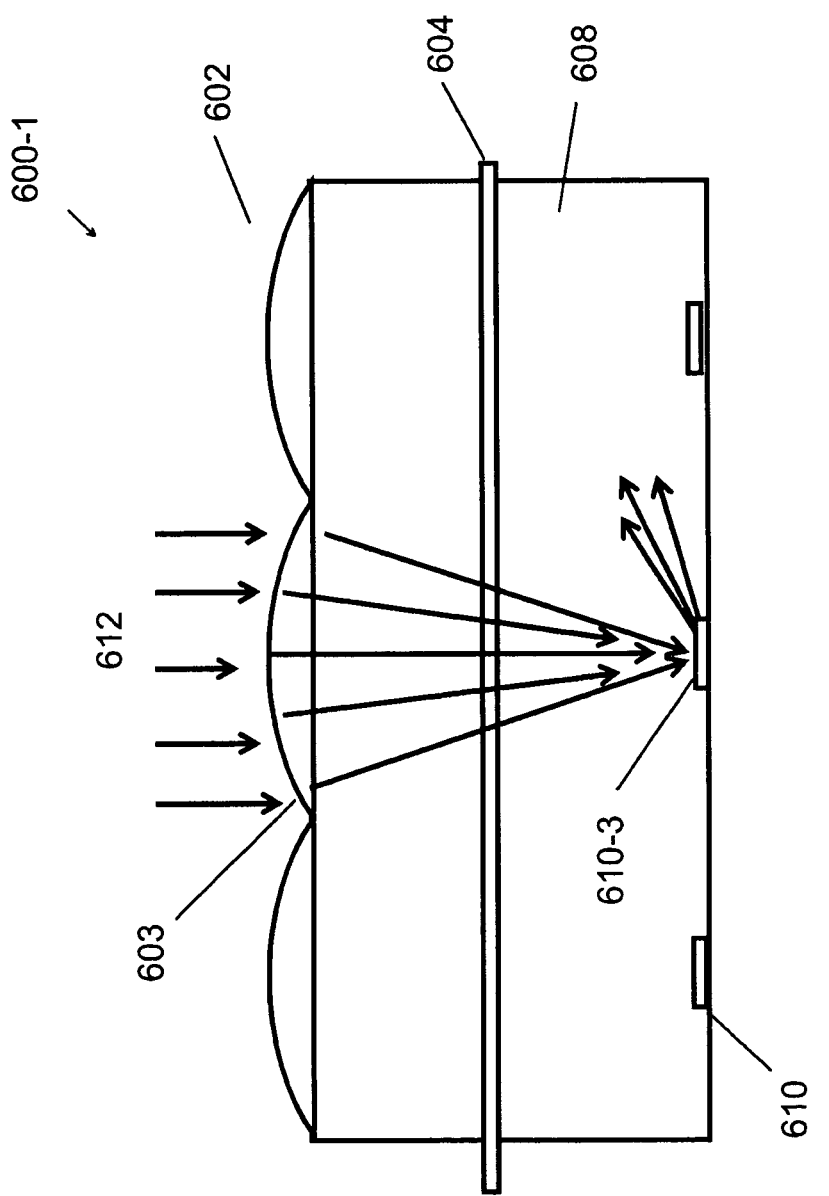
FIG. 6 schematically shows in cross section a light collection and concentration system including a light guide having diffraction-based light injection elements, according to another exemplary aspect of the invention.

FIG. 6 similarly schematically illustrates in cross section a light collection system 600-1 that includes a primary concentrator in the form of a refractive lenslet array 602, a lower index TIR medium layer 604, and a guide layer 608 including reflection diffraction gratings 610 disposed in the bottom surface of the guide layer. Incident light 612 is concentrated (e.g., focused or not) by a lenslet element 603 onto a respective diffraction grating 610-3 whereupon the light diffracts into one or two dominant reflected orders into the guide layer as shown by the arrows therein. This arrangement allows for a shallower groove depth than in the transmission case above, since the delta-n and hence path difference between adjacent groove features is much greater.

Figure 7:
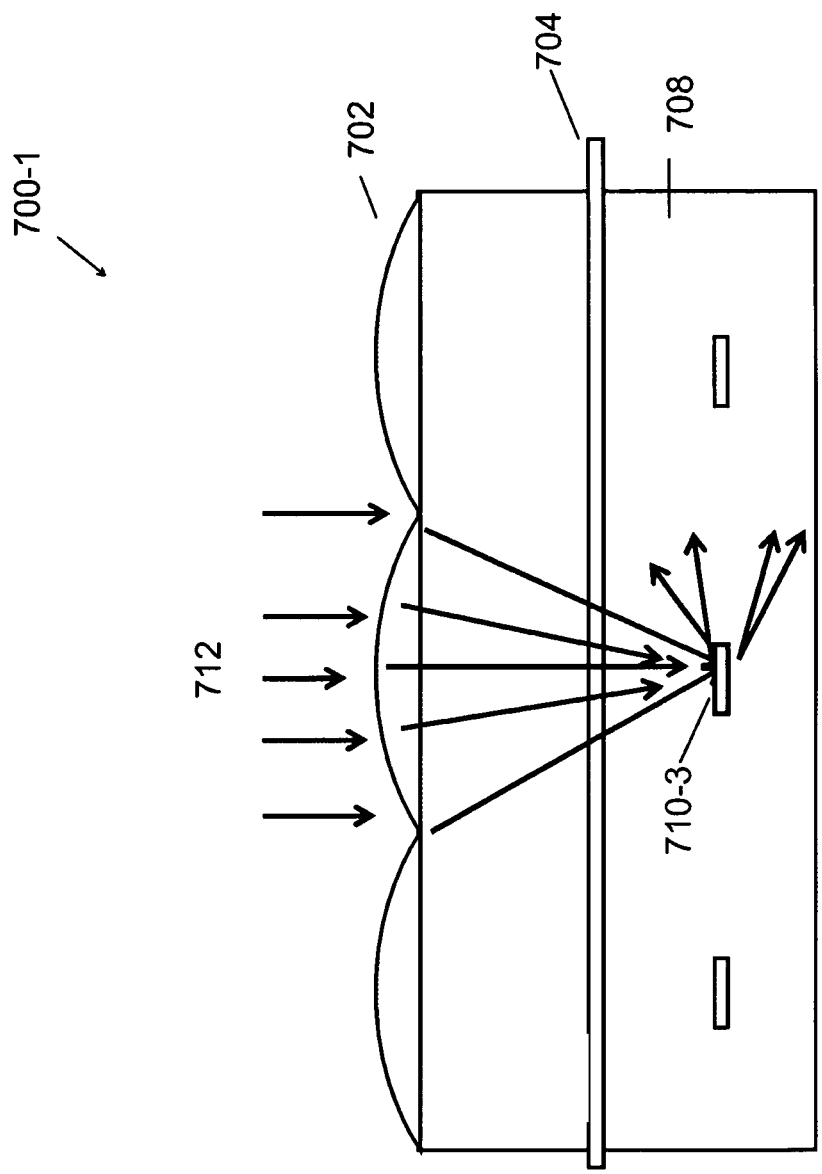
FIG. 7 schematically shows in cross section a light collection and concentration system including a light guide having diffraction-based light injection elements, according to another exemplary aspect of the invention.

FIG. 7 similarly schematically illustrates in cross section a light collection system 700-1 that includes a primary concentrator in the form of a refractive lenslet array 702, a lower index TIR medium layer 704, and a guide layer 708 including a transmission grating 710-3 located intermediate the top and bottom surfaces of the guide layer. Incident light 712 is concentrated onto the grating whereupon both reflected and transmitted orders are diffracted into the guide layer.

In order to locate the diffraction gratings between the top and bottom surfaces of the guide layer, two pieces of material, which together would make up the guide layer may advantageously be glued or cemented together. In an exemplary aspect, the diffractive element is applied to one surface of a plastic or glass guide layer that is ~½ the thickness of the final guide. An adhesive layer is applied on top of this, and another piece of plastic or glass is glued in place. The diffractive element may be written into a polymer-on-glass, silicone-on-glass, or into the plastic or glass directly. The central adhesive layer should be relatively closely index matched to the guiding layer, but it is not a necessity as long as the central layer has an index higher than the low-index TIR layer. According to another exemplary aspect, a laser-writer could be focused at some intermediate point within a continuous guide layer material. The laser would alter the state of the material, either by heating or polymerization as known in the art to make volume holograms, for example.

According to another aspect of the invention, a gradient index of refraction (GRIN) can be provided in the guide layer to act as both a dimple (injection element +bypass element) or merely as a bypass for a different type of injection element, e.g., air prism.

Figure 12:
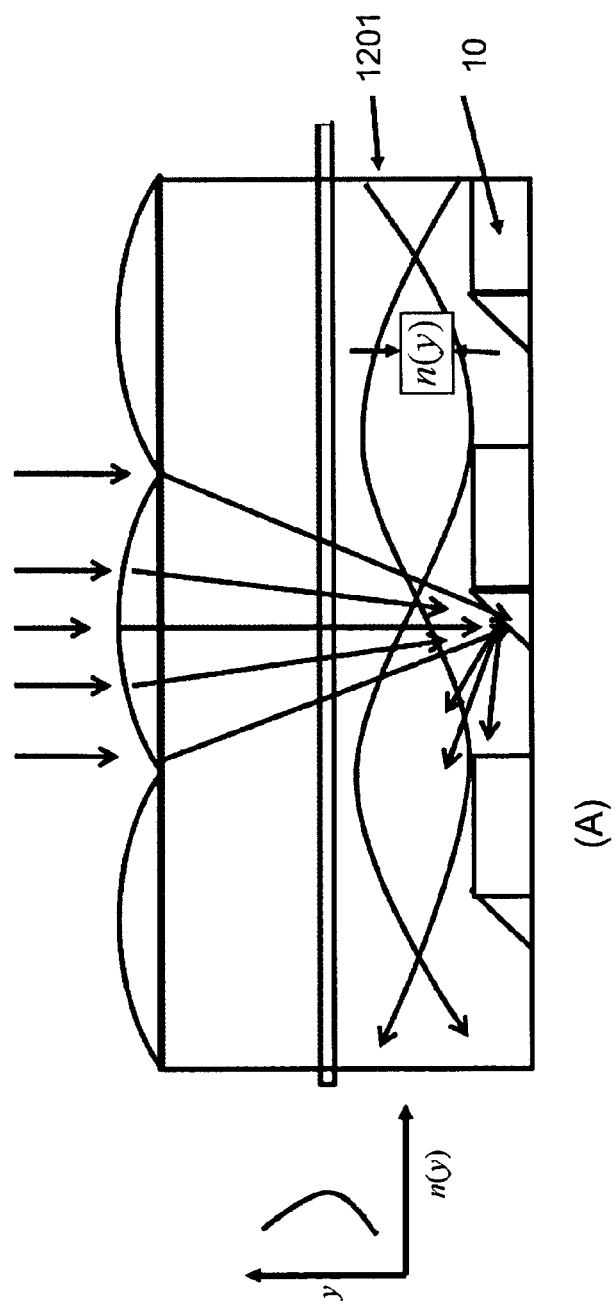
FIGS. 12A, B are a side cross sectional view and a top cross sectional view, respectively, of a GRIN-based light collection and concentration system, according to an exemplary aspect of the invention.
Figure 12:
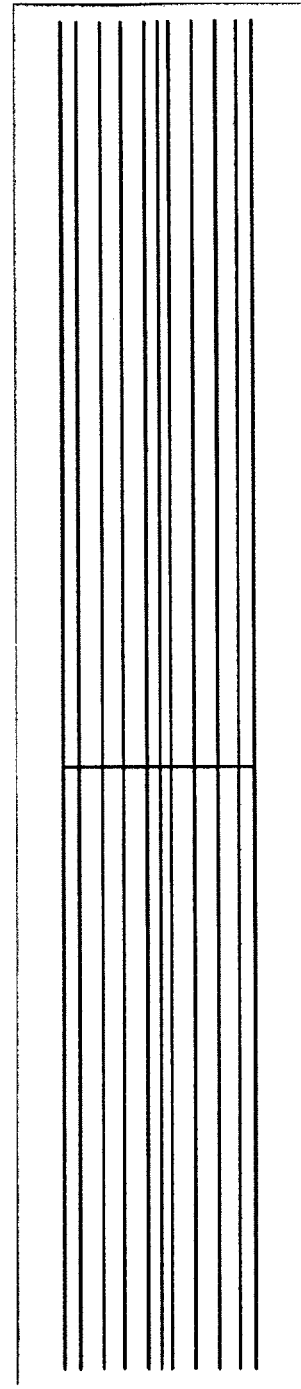

In a first illustrative example discussed with reference to FIGS. 12A, B, a linear or parabolic gradient 1201 in the y-direction may be used to maintain the majority of the propagating light away from the surface-located injection elements or generally in the center region of the guide layer, respectively. The gradient profile in this case would be uniform across the x-z plane as shown in FIG. 12B. Such a gradient would take the form $$n(y)=N_o+N_{o1}y+N_{o2}y^2,$$

where $N_o$ is the base index of refraction, $N_{o1}$ is the linear gradient coefficient, and $N_{o2}$ is the parabolic gradient coefficient.

Figure 13:
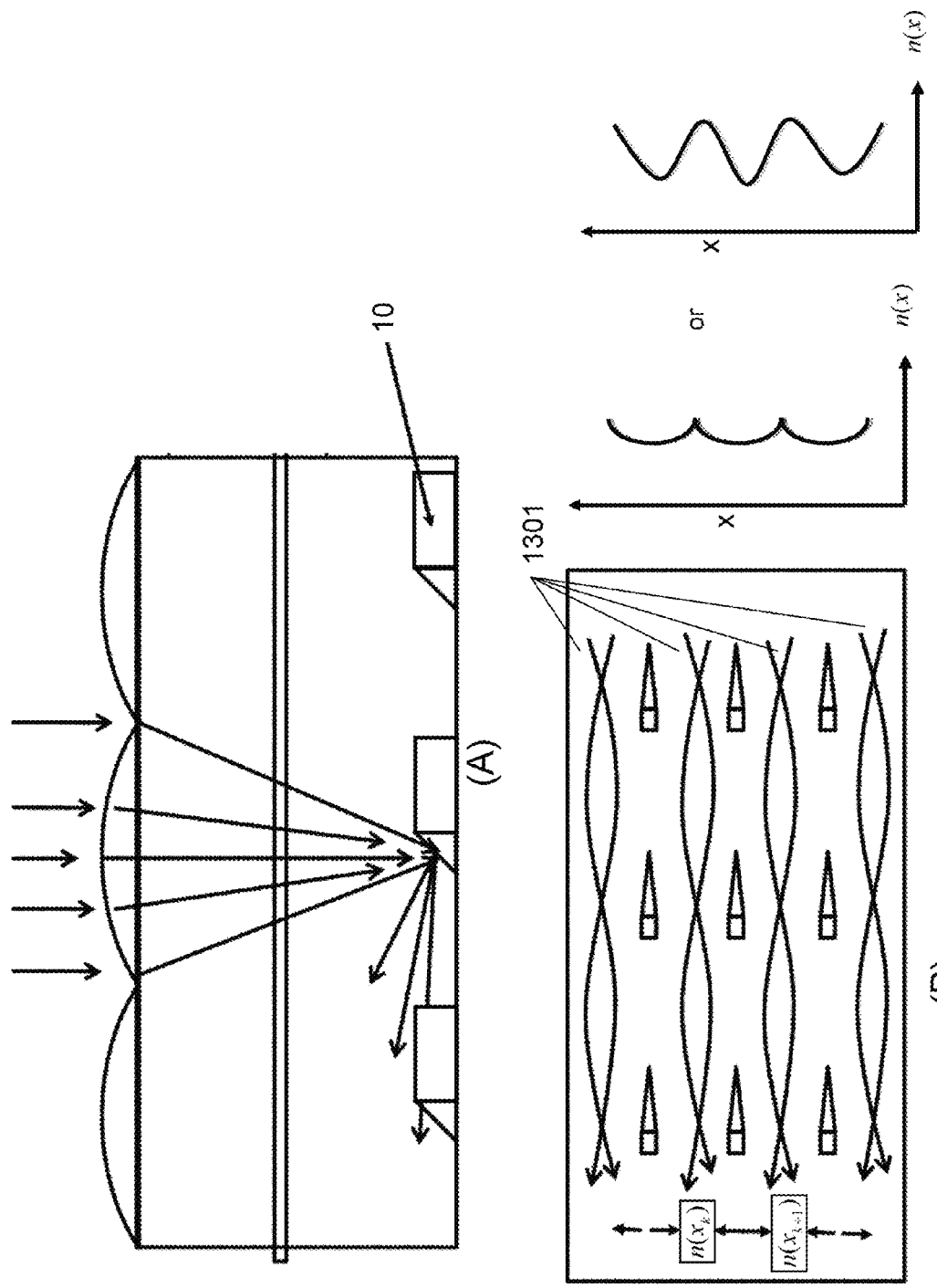
FIGS. 13A, B are a side cross sectional view and a top cross sectional view, respectively, of a GRIN-based light collection and concentration system, according to another exemplary aspect of the invention.

In a second illustrative example, linear or parabolic gradients could be placed in strips 1301 in the z-direction with the gradient in the x-direction as illustrated in FIGS. 13A, B. Here, n(x) is low (minimum) at each z-axis dimple location and high (maximum) at the midpoints between adjacent dimples in the z-direction. This type of gradient would minimize the optical path near each surface injection element by bending light into the free space between dimples. Such a gradient would take the form $$n(x_k)=N_0+N_{01}|x_k|+N_{02}x^2_k,$$

or $n(x_k)=N_0+N_s\sin(b*x_k)$ where $x_k$ is the x-position with respect to the $k^{th}$ dimple in the x-direction, and b is dependent on the spacing of the dimples, $N_{01}$ is the linear gradient coefficient, $N_{02}$ is the second order gradient coefficient, and $N_s$ is the sinusoidal gradient coefficient.

Figure 14:
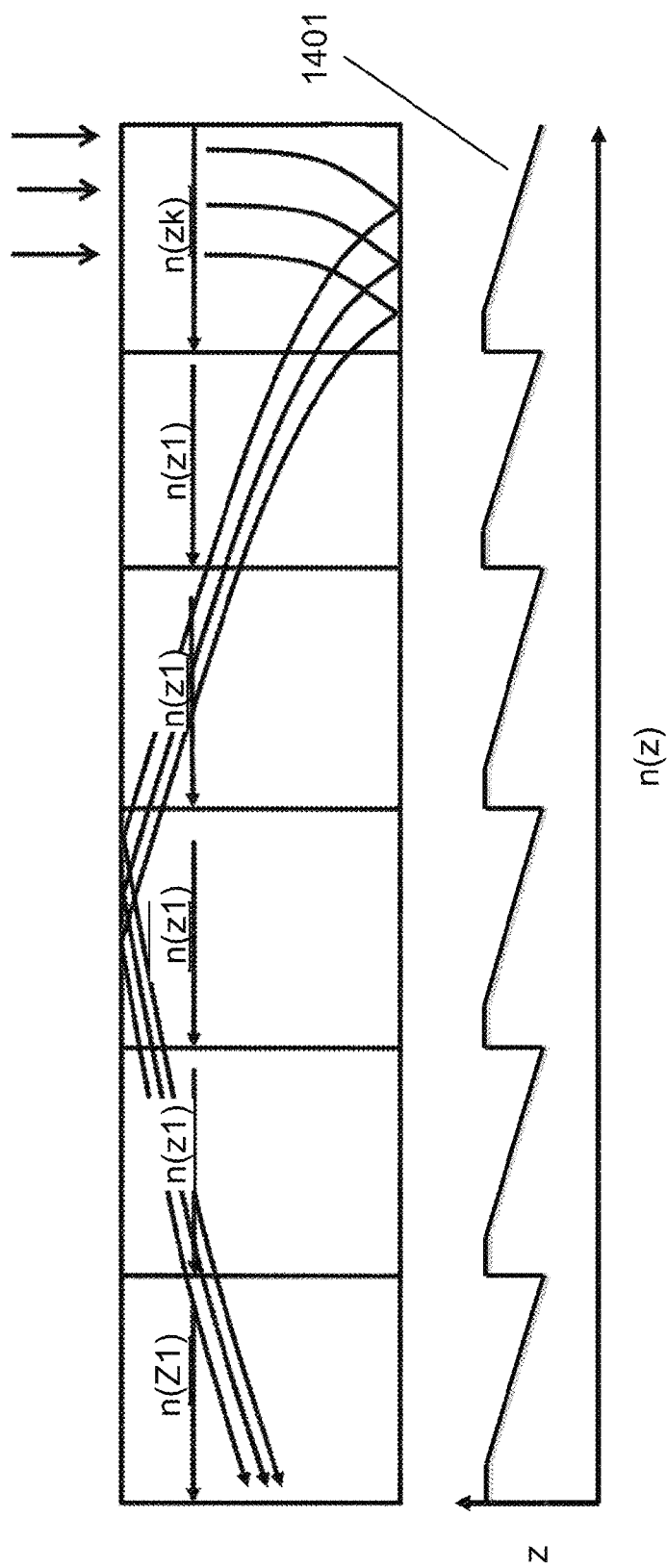
FIG. 14 is a side cross sectional view of a GRIN-based light collection and concentration system, according to another exemplary aspect of the invention.

In a third illustrative example, a series of y-axes strips 1401 of strong gradient could be placed with the gradient along the z-direction and uniform in the x-y plane, as illustrated in FIG. 14. The gradient, along with a first TIR reflection from the bottom surface of the guide layer, would act as the injection mechanism, leaving the guide layer itself free of disruptions to the guide geometry. Such a gradient would take the form $$n(z_k)=N_o+N_{OZ}z_k.$$

In this case, the guide layer may have index discontinuities along the z-axis, which could limit the length of the guide and the upper limit of concentration due to Fresnel losses along the guide layer, unless these discontinuities were eliminated.

In different aspects, the light collection and concentration system according to an embodiment of the invention may be considered as one-sided and two-sided.

As discussed above, the guide layer transports light from each injection facet to the exit aperture of the light guide. The light guide uses total internal reflection (TIR) for nominally lossless propagation of the light, but the guide contains dimples, which interfere with propagation efficiency. Light can only interact with the dimples a few times before angles exceed the critical angle, and this limits the guide length. The TIR angle (or guide numerical aperture) is defined by the difference in index between the guide layer and bounding media. This interface can be with air or a lower index material. For instance, the lenslet layer may be cemented to the guide layer but separated therefrom by a lower-index polymer layer.

Figure 8:
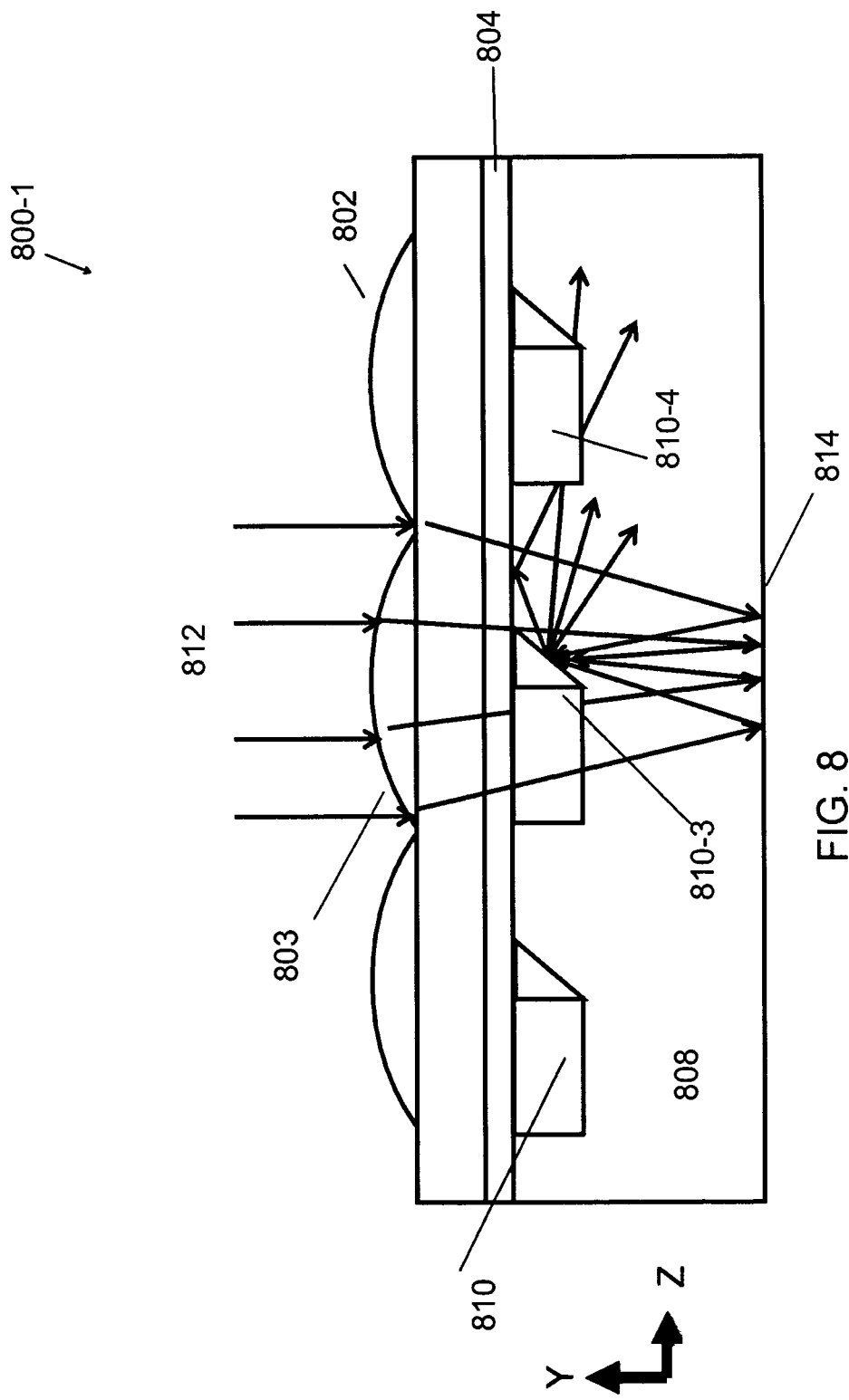
FIG. 8 schematically shows in cross section a one-sided light collection and concentration system, according to an exemplary aspect of the invention.

FIG. 8 shows a schematic, cross sectional view of an illustrative one-sided light collection and concentration system 800-1. According to an exemplary aspect, the one-sided system 800-1 includes a light guide layer 808 including dimples 810 disposed in a top surface thereof, a low-index TIR layer 804 disposed immediately adjacent the top layer, a refractive lenslet array 802 disposed immediately adjacent the TIR layer, and a mirror layer 814 on the bottom surface of the guide. As illustrated, incident solar light 812 is concentrated by lenslet element 803 onto the mirror surface and further concentrated onto respective (to the lenslet element) injection facet 810-3. As the light propagates via TIR in the z-direction, some of it encounters the bypass element of dimple 810-4.

This one-sided system is advantageous because, among other things, the system is folded in half (with respect to the two-sided system, discussed below), thus the thickness of the system is reduced, which reduces weight and material used. Moreover, the lenslets and dimples can be formed by one tool, are formed in potentially the same process step, minimizing the registration errors from a given manufacturing technology. The nominal performance of the one sided light guide, including cover glass, is expected to be greater than 70%.

Figure 9:
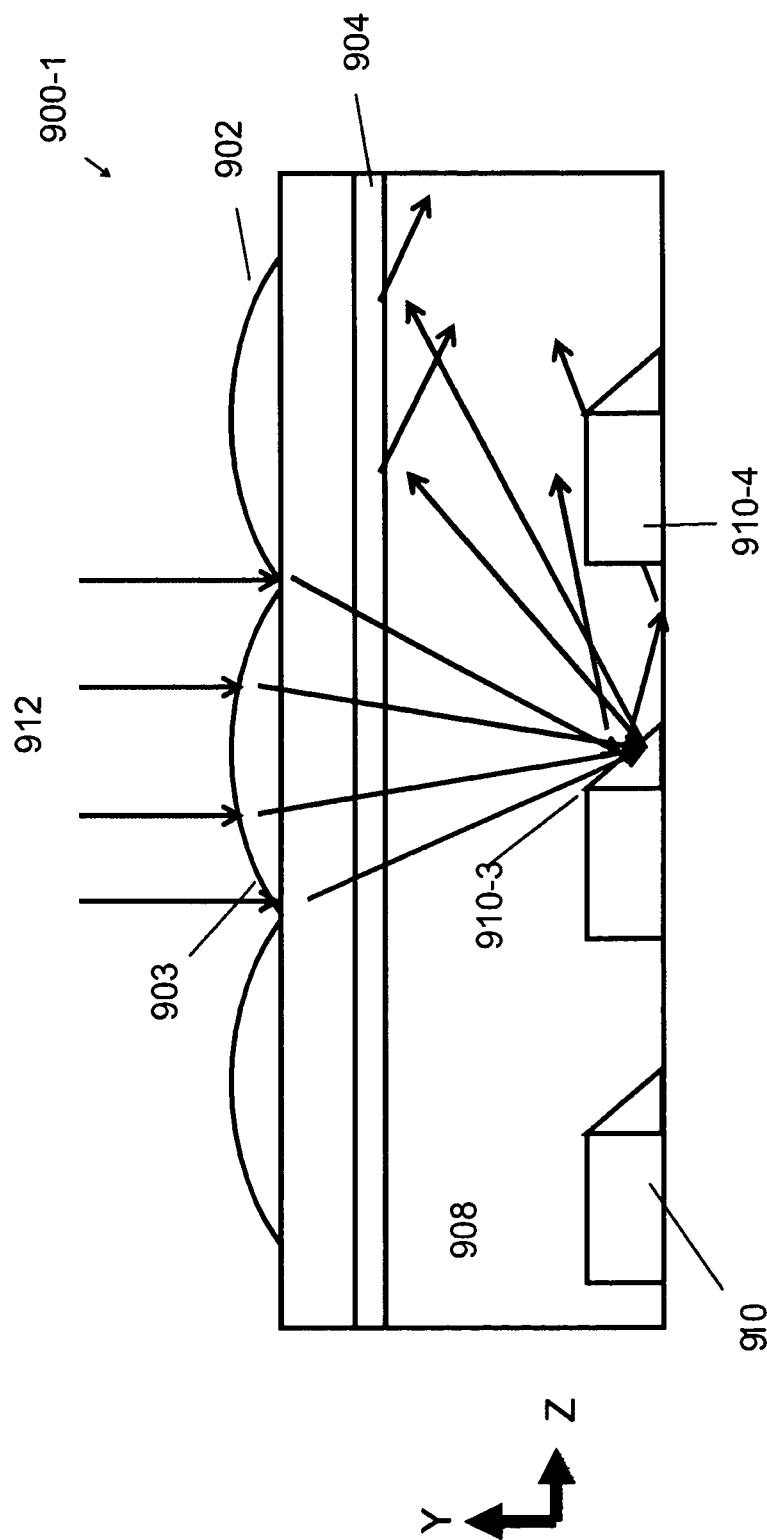
FIG. 9 schematically shows in cross section a two-sided light collection and concentration system, according to another exemplary aspect of the invention.

FIG. 9 shows a schematic, cross sectional view of an illustrative two-sided light collection and concentration system 900-1. Somewhat similar to the one-sided system of FIG. 8, the two-sided system 900-1 includes a light guide layer 908 including dimples 910 disposed in a bottom surface thereof, a low-index TIR layer 904 disposed immediately adjacent the top layer, and a refractive lenslet array 902 disposed immediately adjacent the TIR layer. As illustrated, incident solar light 912 is concentrated by lenslet element 903 onto injection facet 910-3. As the light propagates via TIR in the z-direction, some of it encounters the bypass element of dimple 910-4.

In this aspect, the lenslets and dimples are formed by separate tools, whether injection molded, compression molded, UV curved, or formed from glass. The two separate components are registered and positioned with respect to one another. The dimple structure may be contained within the same part that forms the guide layer or could be formed in a separate layer and cemented to a guide layer substrate. The TIR layer will be composed of a low index material or can simply be an air gap. This layer prevents propagating light from interacting with the lenslet surface, which could significantly decrease the concentrating abilities of the guide.

As described above, the light propagated in the guide layer is out-coupled at the exit end thereof. While the thickness, T (y-dimension), of the guide layer may be on the order of 3 mm-5 mm in an exemplary aspect, the width, W (x-dimension), of the guide layer need not be constrained except that the structure is intended to cumulatively concentrate all of the light input to the guide layer at the exit end for ultimate input to a PV cell. The limited entrance aperture of a PV cell located adjacent (advantageously, immediately adjacent) the exit end of the guide layer may benefit from further concentration of the propagating light, in which case a secondary concentrator between the exit end of the guide layer and the PV cell will be advantageous.

Figures 11A, 11B:
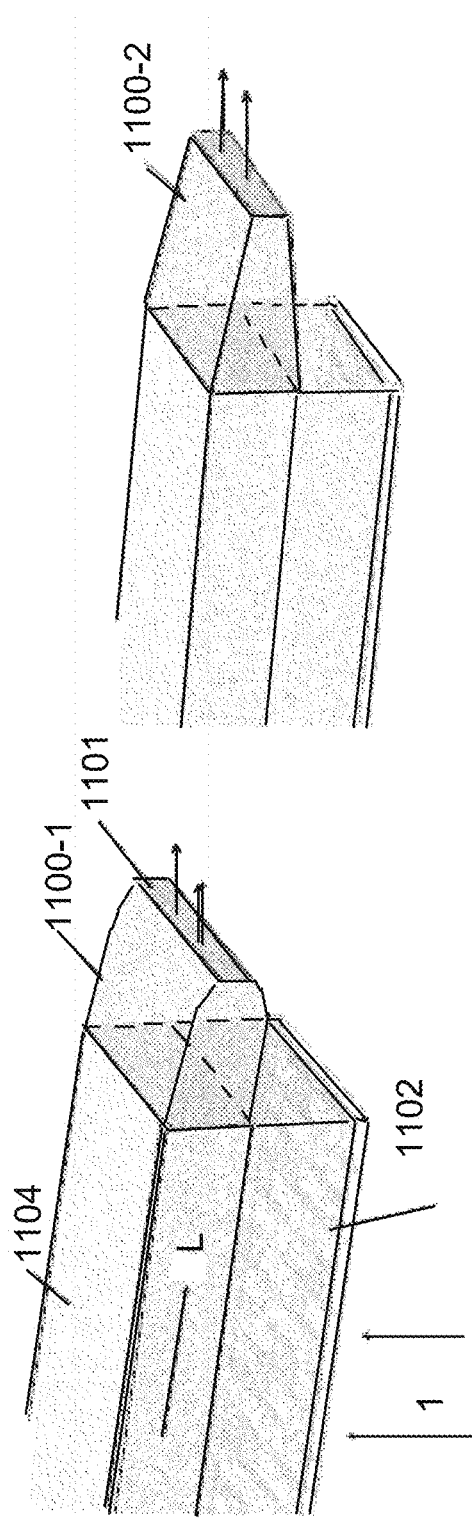
FIGS. 11A, 11B show perspective views of alternative, shaped, secondary light concentrators in the form of a parabolic concentrator and a straight-trapezoidal concentrator, respectively, according to non-limiting, illustrative aspects of the invention.

FIGS. 11A, 11B schematically illustrate two, exemplary, differently shaped secondary concentrators 1100-1, 1100-2 in the form of a parabolic concentrator and a straight-trapezoidal concentrator, respectively. As shown, for example, in FIG. 11A, a primary concentrator section 1102 has a plurality of primary light concentrators, which focus incident light 1 into a single light guide component 1104 having a respective plurality of light injection elements (not shown) as described herein above. The light is propagated in the light guide in the direction L by TIR. A separate compound parabolic secondary concentrator 1100-1 is shown directly coupled (e.g., cemented) to the exit end of the light guide, whereupon the surface 1101 of the secondary concentrator becomes the ultimate exit end of the light guide. Rather than being a separate component, the secondary concentrator 1100-1 (1100-2) may be an integral end of an extruded or molded light guide in the shape of a compound parabola (1100-1) or straight trapezoid (1100-2), for example (other appropriate shapes are not excluded). Depending upon the design of the secondary light concentrator, propagating light may continue to be totally internally reflected until out-coupled or, may be otherwise reflected until out-coupled. Accordingly, the secondary concentrator may be of the same or a different material than the light guide; may be solid, hollow, gas-filled, or otherwise constructed as appropriate to perform its intended function.

The nominal performance of the system depends on the number of optical surfaces (Fresnel losses), the coupling efficiency from lenslets and dimples into the guide, the transmission efficiency within the guide, and any material absorption losses. Since this aspect only has one low index-material interface, Fresnel losses are minimal. Without a cover glass, Fresnel losses account for roughly a 5% loss. A cover glass adds roughly another 10% loss. The coupling efficiency at the dimple depends mainly on dimple size and the prescribed acceptance angle of the system. The nominal design has at most 2% losses from coupling into the guide. Transmission efficiency is the most important issue to address and is dependent on a number of parameters. For a nominal light guide length of 500 mm, the optical efficiency of the two sided system, including cover glass, has been demonstrated to be greater than 80%. The increase over the one-sided aspect comes from light loss savings due to the absence of the mirror surface layer and shadow losses from interruptions to the lenslet apertures.

In order to optimize system performance, it is helpful to understand the effect and interactions of the constituent parts of the dimpled light guide. Étendue "transfer" from input aperture through the lenslets, off each dimple injection facet, and into the guide layer is limited only by Fresnel and absorption losses, injection facet size, and injection facet angle. If the injection facet is undersized, a portion of the acceptance angle and input aperture will simply miss the dimple and be lost. If the light angles incident on the injection facet do not satisfy TIR, those rays will also be lost or attenuated. This sets two basic constraints on system geometry: minimum dimple size and injection facet angle.

Once in the guide, light transmits down the guide layer and may or may not be diverted by one or more bypass elements, depending on light paths within the guide. The goal of the guide is to transfer light from the injection point to the exit point with as few of these interactions as possible. The guide transfer efficiency depends on a number of interlinked parameters. The guide itself acts in much the same way as a kaleidoscope with one surface having periodic disruptions; i.e., the dimples.

The use of the terms "a" and "an" and "the" and similar references in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening.

The recitation of ranges of values herein are merely intended to serve as a shorthand method of referring individually to each separate value falling within the range, unless otherwise indicated herein, and each separate value is incorporated into the specification as if it were individually recited herein.

All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not impose a limitation on the scope of the invention unless otherwise claimed.

No language in the specification should be construed as indicating any non-claimed element as essential to the practice of the invention.

It will be apparent to those skilled in the art that various modifications and variations can be made to the present invention without departing from the spirit and scope of the invention. There is no intention to limit the invention to the specific form or forms disclosed, but on the contrary, the intention is to cover all modifications, alternative constructions, and equivalents falling within the spirit and scope of the invention, as defined in the appended claims. Thus, it is intended that the present invention cover the modifications and variations of this invention provided they come within the scope of the appended claims and their equivalents.

We claim:

1. A light guide apparatus, comprising:
a light guide layer having a top surface and a bottom surface, at least one of which is a substantially planar surface, and a transversely oriented side-end surface that forms an output aperture of the light guide, characterized by an index of refraction, $n_1$, further characterized by a length dimension in an intended light propagation direction towards the output aperture;
a plurality of light injection elements disposed in at least one of the top and bottom surfaces; and
a respective plurality of by-pass elements disposed within the light guide layer optically upstream from each respective light injection element.

2. The light guide apparatus of claim 1, wherein the light injection elements are air prisms.

3. The light guide apparatus of claim 2, wherein the by-pass elements are air prisms.

4. The light guide apparatus of claim 3, wherein each by-pass element has a head end disposed adjacent its respective light injection element and a tail end extending rearwardly therefrom.

5. The light guide apparatus of claim 1, wherein each by-pass element has at least one surface extending between the head and tail ends.

6. The light guide apparatus of claim 5, wherein the at least one side surface is curved.

7. The light guide apparatus of claim 5, wherein the at least one side surface includes two flat surfaces.

8. The light guide apparatus of claim 1, wherein at least one of the plurality of light injection elements is tilted (clocked) in an x-axis direction (width dimension) of the light guide.

9. The light guide apparatus of claim 1, further comprising a light-transmitting medium layer characterized by an index of refraction, $n_{med}$, where $n_{med}$ is less than $n_1$, disposed immediately adjacent at least one of the top and bottom surfaces of the light guide layer.

10. The light guide apparatus of claim 9, wherein the light-transmitting medium layer is air.

11. The light guide apparatus of claim 9, wherein the light-transmitting medium layer is solid.

12. The light guide apparatus of claim 1, wherein at least one of the light injection elements has a curved face surface.

13. The light guide apparatus of claim 1, wherein the plurality of light injection elements and the respective plurality of bypass elements are integrally disposed in the light guide layer.

14. The light guide apparatus of claim 1, wherein the plurality of light injection elements and the respective plurality of bypass elements are integrally disposed in a separate material layer that is attached to the light guide layer and, which, forms at least one of the top and bottom surfaces of the light guide layer.

15. The light guide apparatus of claim 1, wherein the light injection elements are volume diffraction elements.

16. The light guide apparatus of claim 1, wherein the bypass elements are volume diffraction elements.

17. The light guide apparatus of claim 1, wherein each of the bypass elements is one of a linear and a parabolic gradient index profile that is uniform across an x-z plane of the guide layer.

18. The light guide apparatus of claim 1, wherein each of the bypass elements is one of a linear and a parabolic gradient index profile along a z-axis direction with the gradient varying in an x-direction and having a minimum index at a z-axis location of each injection element and a maximum index at a location between adjacent injection elements.

19. A light collection and concentration system, comprising:
a single light guide component comprising:
a light guide layer having a top surface and a bottom surface, at least one of which is a substantially planar surface, and a transversely oriented side-end surface that forms an output aperture of the light guide, characterized by an index of refraction, $n_1$, further characterized by a length dimension in an intended light propagation direction towards the output aperture;
a plurality of light injection elements disposed in at least one of the top and bottom surfaces; and
a respective plurality of bypass elements disposed within the light guide layer optically upstream from each respective light injection element;
a light-transmitting medium layer characterized by an index of refraction, $n_{med}$, where $n_{med}$ is less than $n_1$, disposed immediately adjacent at least one of the top and bottom surfaces of the light guide layer; and
a primary light concentrator component disposed adjacent the light-transmitting medium layer including a plurality of primary concentrator elements each of which is in optical registration with a respective one of the light injection elements.

20. The light collection and concentration system of claim 19, wherein the light-transmitting medium layer is disposed intermediate the primary light concentrator component and the top surface of the light guide layer.

21. The light collection and concentration system of claim 20, wherein the plurality of light injection elements are disposed in the bottom surface of the light guide layer.

22. The light collection and concentration system of claim 20, wherein the plurality of light injection elements are disposed in the top surface of the light guide layer, further comprising a reflective material layer disposed adjacent the bottom surface of the light guide layer.

23. The light collection and concentration system of claim 19, wherein the primary light concentrator component is a refractive lenslet array.

24. The light collection and concentration system of claim 23, wherein each of the lenslets have curvature in two dimensions.

25. The light collection and concentration system of claim 24, wherein the curvatures are equal.

26. The light collection and concentration system of claim 19, wherein the primary light concentrator component is an array of Fresnel lenses.

27. The light collection and concentration system of claim 19, wherein the primary light concentrator component has optical characteristics that provide converging light on the injection elements from a substantially plane wave input light.

28. The light collection and concentration system of claim 19, wherein the light injection elements are air prisms.

29. The light collection and concentration system of claim 19, wherein the bypass elements are air prisms.

30. The light collection and concentration system of claim 19, wherein the light injection elements are volume diffraction elements.

31. The light collection and concentration system of claim 19, wherein the bypass elements are volume diffraction elements.

32. The light collection and concentration system of claim 19, wherein each of the bypass elements is one of a linear and a parabolic gradient index profile that is uniform across an x-z plane of the guide layer.

33. The light collection and concentration system of claim 19, wherein each of the bypass elements is one of a linear and a parabolic gradient index profile along a z-axis direction with the gradient varying in an x-direction and having a minimum index at a z-axis location of each injection element and a maximum index at a location between adjacent injection elements.

* * * * *